Figure 1:
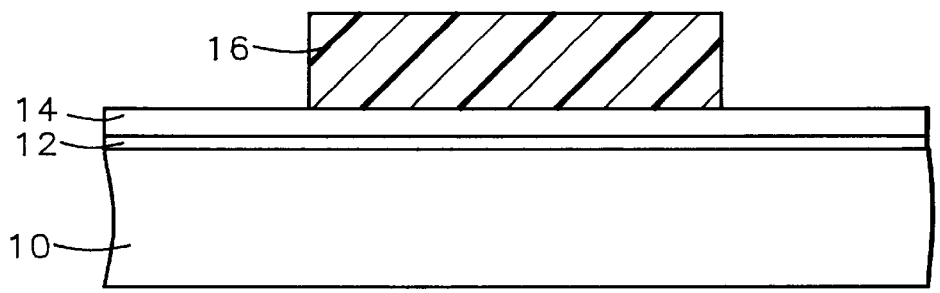

United States Patent
Kuo et al.

[11] Patent Number: 6,024,887
[45] Date of Patent: Feb. 15, 2000

[54] PLASMA METHOD FOR STRIPPING ION IMPLANTED PHOTORESIST LAYERS

[75] Inventors: So-Wen Kuo; Chin-Shan Hou; Yung Jung Chang, all of Hsin-Chu, Taiwan

[73] Assignee: Taiwan Semiconductor Manufacturing Company, Hsin-Chu, Taiwan

[21] Appl. No.: 08/868,342

[22] Filed: Jun. 3, 1997

[51] Int. Cl.[7] ..................................................... C23F 1/00
[52] U.S. Cl. ............................. 216/48; 216/55; 216/62; 216/67; 438/710; 438/723
[58] Field of Search ................. 216/48, 55, 62, 216/67; 438/710, 723; 252/79.3

[56] References Cited

U.S. PATENT DOCUMENTS

| | | | |
|---|---|---|---|
| 4,938,839 | 7/1990 | Fujimura et al. | 156/628 |
| 5,310,703 | 5/1994 | Visser et al. | 437/229 |
| 5,346,586 | 9/1994 | Keller | 156/656 |
| 5,362,670 | 11/1994 | Iguchi et al. | 438/228 |
| 5,393,374 | 2/1995 | Sato et al. | 216/67 |
| 5,401,359 | 3/1995 | Kadomura | 438/16 |
| 5,780,338 | 7/1998 | Jeng et al. | 438/253 |
| 5,882,962 | 3/1999 | Tseng et al. | 438/197 |

*Primary Examiner*—Randy Gulakowski
*Assistant Examiner*—Allan Olsen
*Attorney, Agent, or Firm*—George O. Saile; Stephen B. Ackerman; Alek P. Szecsy

[57] ABSTRACT

A method for stripping an ion implanted photoresist layer from a substrate. There is first provided a substrate. There is then formed over the substrate an ion implanted photoresist layer. There is then treated the ion implanted photoresist layer with a first plasma employing a first etchant gas composition comprising a fluorine containing species to form a fluorine plasma treated ion implanted photoresist layer. Finally, there is then stripped from the substrate the fluorine plasma treated ion implanted photoresist layer with a second plasma employing a second etchant gas composition comprising an oxygen containing species without the fluorine containing species. The ion implanted photoresist layer is stripped from the substrate without plasma induced damage to the substrate. The method is particularly useful for stripping from semiconductor substrates ion implanted patterned photoresist layers employed in forming ion implant regions within those semiconductor substrates prior to thermally oxidizing those semiconductor substrates to form thermal silicon oxide layers upon those semiconductor substrates.

16 Claims, 3 Drawing Sheets

PLASMA METHOD FOR STRIPPING ION IMPLANTED PHOTORESIST LAYERS

BACKGROUND OF THE INVENTION

1. Field of the Invention

The present invention relates generally to methods and materials for stripping photoresist layers from substrates employed within microelectronics fabrications. More particularly, the present invention relates to methods and materials for stripping ion implanted photoresist layers from substrates employed within microelectronics fabrications.

2. Description of the Related Art

Integrated circuit microelectronics fabrications are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

In the process of forming resistors, transistors, diodes and other electrical circuit elements within and upon semiconductor substrates, it is common in the art of integrated circuit microelectronics fabrication to form through ion implantation methods within discrete portions of semiconductor substrates or semiconductor layers formed over semiconductor substrates discrete ion implanted semiconductor regions. Such discrete ion implanted semiconductor regions are typically formed through ion implantation methods which employ patterned photoresist layers as ion implantation mask layers.

While patterned photoresist layers typically serve well as ion implantation mask layers in forming discrete ion implanted semiconductor regions within semiconductor substrates or semiconductor layers employed within integrated circuit microelectronics fabrications, it is often nonetheless found that ion implanted patterned photoresist layers which have been employed as ion implantation mask layers are difficult to subsequently strip from semiconductor substrates or semiconductor layers through oxygen plasma stripping methods which are conventionally employed in stripping photoresist layers from substrate layers within microelectronics fabrications such as integrated circuit microelectronics fabrications. The difficulty in stripping such ion implanted patterned photoresist layers employing conventional oxygen plasma stripping methods presumably derives from oxidation of implanted dopant species within the ion implanted patterned photoresist layers. In order to remove those presumably oxidized implanted dopant species along with the ion implanted patterned photoresist layers, there is often conventionally employed within integrated circuit microelectronics fabrications either high power oxygen plasma stripping methods or corrosive plasma stripping methods, such as fluorine containing plasma stripping methods, which often damage the substrate layers from which are stripped the ion implanted patterned photoresist layers. Damage to substrate layers incident to stripping from those substrate layers ion implanted patterned photoresist layers is undesirable within microelectronics fabrications, such as but not limted to integrated circuit microelectronics fabrications, since it is often difficult to fabricate within or upon those damaged substrate layers fully functional or reliable microelectronics fabrications.

It is thus towards the goal of removing from substrate layers employed within microelectronics fabrications ion implanted photoresist layers without damaging those substrate layers that the present invention is generally directed.

Various methods have been disclosed in the art of integrated circuit microelectronics fabrication for removing photoresist layers from substrate layers. For example, Fujimura et al., in U.S. Pat. No. 4,938,839, describe a method for removing an ion implanted patterned photoresist layer from a semiconductor substrate. The method employs cooling the semiconductor substrate while the ion implanted patterned photoresist layer is stripped from the semiconductor substrate with a plasma of an etchant gas composition comprising oxygen.

In addition, Visser et al., in U.S. Pat. No. 5,310,703, discloses a plasma method for stripping a photoresist layer from upon a silicon oxide layer formed over a semiconductor substrate within an integrated circuit microelectronics fabrication, where there is simultaneously avoided migration of inorganic contaminants from the photoresist layer into the silicon oxide layer. To realize this object, the silicon oxide layer is maintained at a positive bias voltage with respect to a plasma employed within the plasma method.

Finally, Keller, in U.S. Pat. No. 5,346,586, discloses a method for selectively etching a polysilicon gate electrode layer to a gate oxide layer while employing a hard mask patterned with a patterned photoresist layer within an integrated circuit microelectronics fabrication. The method employs an in-situ ozone plasma strip of the patterned photoresist layer from the hard mask layer prior to selectively etching the polysilicon gate electrode layer, in order to provide optimal integrated circuit microelectronics fabrication efficiency.

Desirable in the art are additional methods through which ion implanted patterned photoresist layers may be stripped from substrate layers within microelectronics fabrications such as but not limited to integrated circuit microelectronics fabrications without damaging those substrate layers. It is towards that goal that the present invention is more specifically directed.

SUMMARY OF THE INVENTION

A first object of the present invention is to provide a method for stripping an ion implanted photoresist layer from a substrate employed in a microelectronics fabrication.

A second object of the present invention is to provide a method in accord with the first object of the present invention, where the substrate is not damaged when stripping the ion implanted photoresist layer from the substrate.

A third object of the present invention is to provide a method in accord with the first object of the present invention or the second object of the present invention, where the substrate is a semconductor substrate employed within an integrated circuit microelectronics fabrication and the photoresist layer is a patterned photoresist layer employed as a patterned photoresist ion implantation mask layer in forming an ion implanted region within the seimiconductor substrate.

A fourth object of the present invention is to provide a method in accord with the first object of the present invention, the second object of the present invention or the third object of the present invention, which method is readily manufacturable.

In accord with the objects of the present invention, there is provided by the present invention a method for stripping an ion implanted photoresist layer from a substrate employed within a microelectronics fabrication. To practice the method of the present invention, there is first provided a substrate employed within a microelectronics fabrication. There is then formed over the substrate an ion implanted photoresist layer. The ion implanted photoresist layer is then treated with a first plasma employing a first etchant gas composition comprising a fluorine containing species to form a fluorine containing plasma treated ion implanted photoresist layer. Finally, there is stripped from the substrate the fluorine containing plasma treated ion implanted photoresist layer with a second plasma employing a second etchant gas composition comprising an oxygen containing species without the fluorine containing species.

The present invention provides a method for stripping an ion implanted photoresist layer from a substrate, where the substrate is not damaged when stripping the ion implanted photoresist layer from the substrate. By employing within the method of the present invention the first plasma employing the first etchant gas composition comprising the fluorine containing species to form from the ion implanted photoresist layer the fluorine containing plasma treated ion implanted photoresist layer prior to stripping the fluorine containing plasma treated ion implanted photoresist layer from the substrate with the second plasma employing the second etchant gas composition comprising the oxygen containing species without the fluorine containing species, there is provided by the present invention a method for stripping an ion implanted photoresist layer from a substrate without damaging the substrate. While the mechanism through which the ion implanted photoresist layer is readily removed from the substrate through the method of the present invention is not well understood, it is believed that the first plasma employing the first etchant gas composition comprising the fluorine containing species assists in removing implanted species from the ion implanted photoresist layer when forming the fluorine containing plasma treated ion implanted photoresist layer which is subsequently stripped from the substrate with the second plasma employing the second etchant gas composition comprising the oxygen containing species without the fluorine containing species.

The present invention may be employed where the substrate is a semiconductor substrate and where the photoresist layer is a patterned photoresist layer employed as a patterned photoresist ion implantation mask layer in forming an ion implanted region within the semiconductor substrate. The method of the present invention does not discriminate with respect to the nature of the substrate or the nature of the photoresist layer which is formed upon the substrate. Thus, although the method of the present invention is most likely to be employed when the substrate is a semiconductor substrate and the photoresist layer is a patterned photoresist ion implantation mask layer employed in masking the semiconductor substrate when selectively implanting ions into the semiconductor substrate, the method of the present invention may also be employed when the substrate is other than a semiconductor substrate and the photoresist layer is employed as other than a photoresist ion implantation mask layer for the semiconductor substrate.

The method of the present invention is readily manufacturable. The method of the present invention provides for a novel ordering of microelectronics fabrication processing methods undertaken within specific parameter limitations, where the microelectronics fabrication processing methods are generally known in the art of microelectronics fabrication. Thus, the method of the present invention is readily manufacturable.

BRIEF DESCRIION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein:

FIG. 1 to FIG. 9 show a series of schematic cross-sectional diagrams illustrating the results of progressive stages in forming upon a semiconductor substrate employed within an integrated circuit microelectronics fabrication a metal oxide semiconductor field effect transistor (MOSFET) structure having incorporated therein a channel stop ion implantation structure and a threshold voltage adjusting ion implantation structure formed employing patterned photoresist ion implantation mask layers which are stripped from the semiconductor substrate in accord with a preferred embodiment of the method of the present invention.

DESCRIPTION OF THIE PREFERRED EMBODIMENT

The present invention provides a method for stripping an ion implanted photoresist layer from a substrate employed within a microelectronics fabrication, without damaging the substrate. To realize this object, the present invention provides that there is first provided a substrate employed within a microelectronics fabrication. There is then formed over the substrate an ion implanted photoresist layer. The ion implanted photoresist layer is then treated with a first plasma employing a first etchant gas composition comprising a fluorine containing species to form a fluorine plasma treated ion implanted photoresist layer. Finally, the fluorine plasma treated ion implanted photoresist layer is stripped from the substrate with a second plasma employing a second etchant gas composition comprising an oxygen containing species without the fluorine containing species.

Although the preferred embodiment of the method of the present invention illustrates the method of the present invention employed in stripping from a semiconductor substrate employed within an integrated circuit microelectronics fabrication a series of ion implanted patterned photoresist layers employed as patterned ion implantation mask layers when forming ion implantation structures within the semiconductor substrate incident to forming a metal oxide semiconductor field effect transistor (MOSFET) within and upon the semiconductor substrate, the method of the present invention may also be employed in stripping ion implanted photoresist layers from substrates other than semiconductor substrates employed within integrated circuit microelectronics fabrications. In that regard, the method of the present invention may be employed in stripping ion implanted photoresist layers from substrates employed within microelectronics fabrications including but not limited to integrated circuit microelectronics fabrications, solar cell microelectronics fabrications, ceramic packaging microelectronics fabrications and flat panel display microelectronics fabrications.

Referring now to FIG. 1 to FIG. 9, there is shown a series of schematic cross-sectional diagrams illustrating the results of progressive stages in forming within an integrated circuit microelectronics fabrication a metal oxide semiconductor field effect transistor (MOSFET) having formed therein multiple ion implantation structures formed employing patterned photoresist ion implantation mask layers which are stripped from the semiconductor substrate in accord with a preferred embodiment of a method of the present invention. Shown in FIG. 1 is a schematic cross-sectional diagram of the integrated circuit microelectronics fabrication at an early stage in its fabrication.

Shown in FIG. 1 is a semiconductor substrate 10, having formed thereupon a blanket pad oxide layer 12 which in turn has formed thereupon a blanket silicon nitride layer 14. In turn, the blanket silicon nitride layer 14 has formed thereupon a patterned first photoresist layer 16.

Although semiconductor substrates are known in the art of integrated circuit microelectronics fabrication with either dopant polarity, various dopant concentrations and several crystallographic orientations, for the preferred embodiment of the present invention, the semiconductor substrate 10 is preferably a (100) silicon semiconductor substrate having an N- or P-doping. Similarly, although it is also known in the art of integrated circuit microelectronics fabrication that blanket pad oxide layers and blanket silicon nitride layers may be formed through methods including but not limited thermal oxidation methods, chemical vapor deposition (CVD) methods and plasma enhanced chemical vapor deposition (PECVD) methods, for the preferred embodiment of the present invention, the blanket pad oxide layer 12 is preferably formed through a thermal oxidation method at a temperature of from about 900 to about 950 degrees centigrade to form the blanket pad oxide layer 12 of thickness about 150 to about 250 angstroms upon the semiconductor substrate 10. Similarly, the blanket silicon nitride layer 14 is preferably formed through a chemical vapor deposition (CVD) method to form the blanket silicon nitride layer 14 of thickness about 1000 to about 2000 angstroms upon the blanket pad oxide layer 12.

Finally, although it is known in the art of integrated circuit microelectronics fabrications that patterned photoresist layers may be formed from photoresist materials including but not limited to photoresist materials chosen from the general groups of photoresist materials including but not limited to positive photoresist materials and negative photoresist materials, for the preferred embodiment of the method of the present invention, the patterned first photoresist layer 16 is preferably formed of a positive photoresist material since positive photoresist materials are more likely to provide patterned photoresist layers of enhanced dimensional stability. Other photoresist materials may, however, be employed in forming the patterned first photoresist layer 16. Preferably, the patterned first photoresist layer 16 is formed to a thickness of from about 8000 to about 9000 angstroms upon the blanket silicon nitride layer 14.

Figure 2:
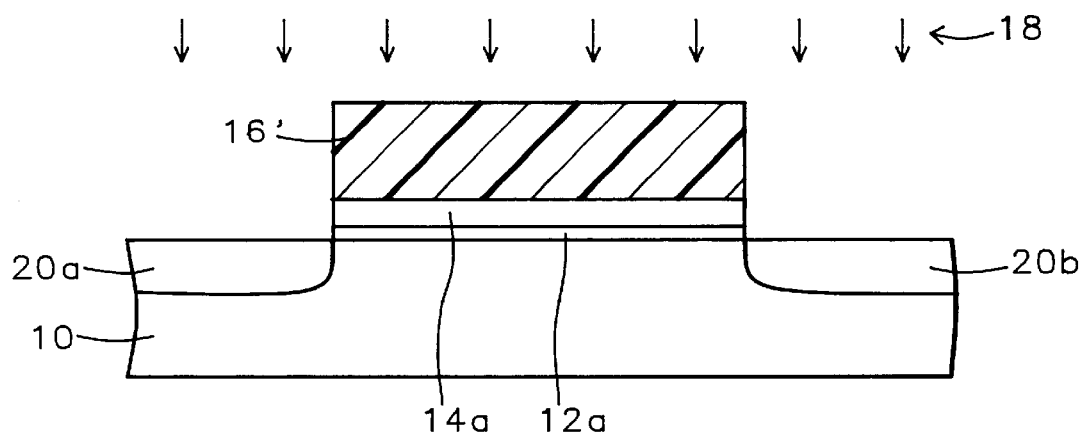

Referring now to FIG. 2, there is shown a schematic cross-sectional diagram illustrating the results of further processing of the integrated circuit microelectronics fabrication whose schematic cross-sectional diagram is illustrated in FIG. 1. Shown in FIG. 2 is an integrated circuit microelectronics fabrication otherwise equivalent to the integrated circuit microelectronics farication whose schematic cross-sectional diagram is illustrated in FIG. 1, but wherein: (1) the blanket silicon nitride layer 14 and the blanket pad oxide layer 12 have been patterned to form the patterned silicon nitride layer 14a and the patterned pad oxide layer 12a; and (2) there is then implanted into portions of the semiconductor substrate 10 not covered by the patterned first photoresist layer 16 a pair of channel stop ion implant regions 20a and 20b through use of a dose channel stop implanting ions 18. When forming the pair of channel stop ion implant regions 20a and 20b through use of the dose of channel stop implanting ions 18, there is formed from the patterned first photoresist layer 16 an ion implanted patterned first photoresist layer 16'.

In order to form from the integrated circuit microelectronics fabrication whose schematic cross-sectional diagram is illustrated in FIG. 1 the integrated circuit microelectronics fabrication whose schematic cross-sectional diagram is illustrated in FIG. 2, the blanket silicon nitride layer 14 and the blanket pad oxide layer 12 may be successively etched to form the patterned silicon nitride layer 14a and the patterned pad oxide layer 12a while employing the pattened photoresist layer 16 as an etch mask layer through methods as are conventional in the art of integrated circuit microelectronics fabrication. Such methods which will typically, although not exclusively, include reactive ion etch (RIE) plasma etch methods employing etchant gas compositions which are appropriate to the blanket silicon nitride layer 14 and the blanket pad oxide layer 12.

Similarly, in order to form from the integrated circuit microelectronics fabrication whose schematic cross-sectional diagram is illustrated in FIG. 1 the integrated circuit microelectronics fabrication whose schematic cross-sectional diagram is illustrated in FIG. 2, portions of the semiconductor substrate 10 not covered by the patterned first photoresist layer 16 may be implanted with the dose of channel stop implanting ions 18 to form the channel stop ion implant structures 20a and 20b through ion implantation methods as are conventional in the art of integrated circuit microelectronics fabrication. In that regard, the dose of channel stop implanting ions 18 is typically of polarity opposite to the polarity of the semiconductor substrate 10 employed within the integrated circuit microelectronics fabrication whose schematic cross-sectional diagram is shown in FIG. 1 and FIG. 2. Arsenic containing channel stop implanting ions, boron containing channel stop implanting ions and phosphorus containing channel stop implanting ions are common in the art of integrated circuit microelectronics fabrication. For the preferred embodiment of the method of the present invention, the dose of channel stop implanting ions 18 is preferably provided into the portions of the semiconductor substrate 10 not covered by the patterned first photoresist layer 16 to simultaneously form the channel stop ion implant regions 20a and 20b, and the ion implanted patterned photoresist layer 16', at an ion implantation dose of from about 9E12 to about 2E13 ions per square centimeter and an ion implantation energy of from about 110 to about 130 keV.

Figure 3:
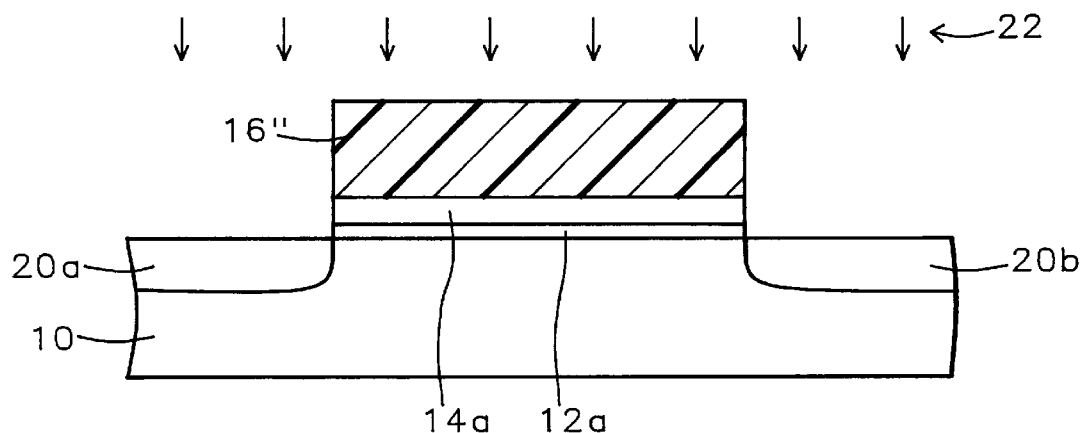

Referring now to FIG. 3, there is shown a schematic cross-sectional diagram illustrating the results of further processing of the integrated circuit microelectronics fabrication whose schematic cross-sectional diagram is illustrated in FIG. 2. Shown in FIG. 3 is an integrated circuit microelectronics fabrication otherwise equivalent to the integrated circuit microelectronics fabrication whose schematic cross-sectional diagram is illustrated in FIG. 2, but wherein the ion implanted patterned photoresist layer 16' is treated with a first plasma 22 to form a fluorine containing plasma treated patterned first photoresist layer 16". Within the method of the present invention, the first plasma 22 employs a first etchant gas composition comprising a fluorine contain species.

Within the method of the present invention, the fluorine containing species may include, but is not limited to fluorine, fluorocarbons and perfluorocarbons. In addition, the first etchant gas composition may also comprise reactive or non-reactive diluents, such as but not limted to oxygen, ozone, helium, nitrogen and/or argon. Preferably, the first etchant gas composition comprises hexafluoroethane and oxygen. More preferably, the first etchant gas composition consists essentially of hexafluoroethane and oxygen. Yet more preferably, the first plasma 22 also employs: (1) a reactor chamber pressure of from about 5 to about 15 torr; (2) a radio frequency power of from about 500 to about 700 watts at a radio frequency of 13.56 MHz; (3) a semiconductor substrate 10 temperature of from about 200 to about 300 degrees centigrade; (4) a hexafluoroethane flow rate of from about 20 to about 60 standard cubic centimeters per minute (sccm); (5) an oxygen flow rate of from about 6000 to about 10000 standard cubic centimeters per minute (sccm); and (6) an exposure time of from about 10 to about 50 seconds.

Figure 4:
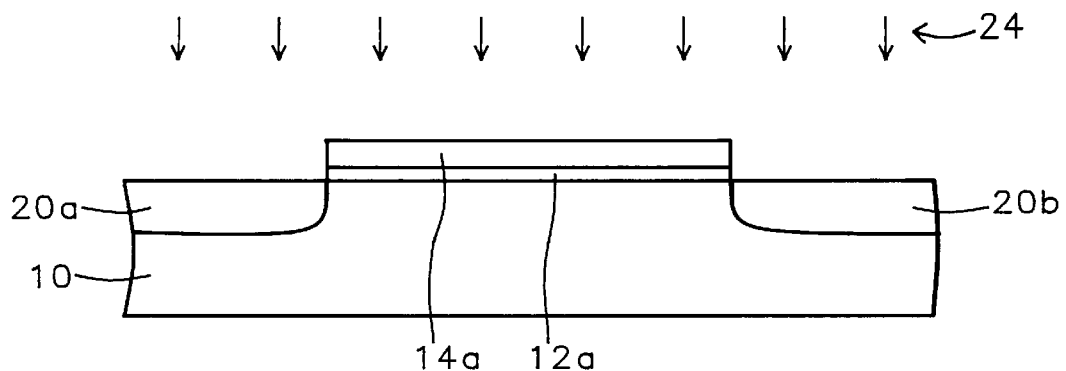

Referring now to FIG. 4, there is shown a schematic cross-sectional diagram illustrating the results of further processing of the integrated circuit microelectronics fabrication whose schematic cross-sectional diagram is illustrated in FIG. 3. Shown in FIG. 4 is a schematic cross-sectional diagram of an integrated circuit microelectronics fabrication otherwise equivalent to the integrated circuit microelectronics fabrication whose schematic cross-sectional diagram is illustrated in FIG. 3, but from whose surface has been removed through use of a second plasma the fluorine containing plasma treated ion implanted patterned first photoresist layer 16". Within the method of the present invention, the second plasma 24 employs a second etchant gas composition comprising an oxygen containing species without the fluorine containing species employed within the first plasma. Preferably, the oxygen containing species is selected from the group of oxygen containing species consisting of oxygen and ozone, although other oxygen containing species may also be employed within the method of the present invention. More preferably, the oxygen containing species is oxygen. Yet more preferably, second plasma 24 also employs: (1) a reactor chamber pressure of from about 5 to about 15 torr; (2) a radio frequency power of from about 500 to about 700 watts; (3) a semiconductor substrate 10 temperature of from about 200 to about 300 degrees centigrade; and (4) an oxygen flow rate of from about 6000 to about 10000 standard cubic centimeters per minute (sccm). The second plasma is preferably employed for an exposure time sufficient to completely remove the fluorine containing plasma treated ion implanted patterned first photoresist layer 16" from the integrated circuit microelectronics fabrication whose schematic cross-sectional diagram is illustrated in FIG. 3 when forming the integrated circuit microelectronics fabrication whose schematic cross-sectional diagram is illustrated in FIG. 4.

Figure 5:
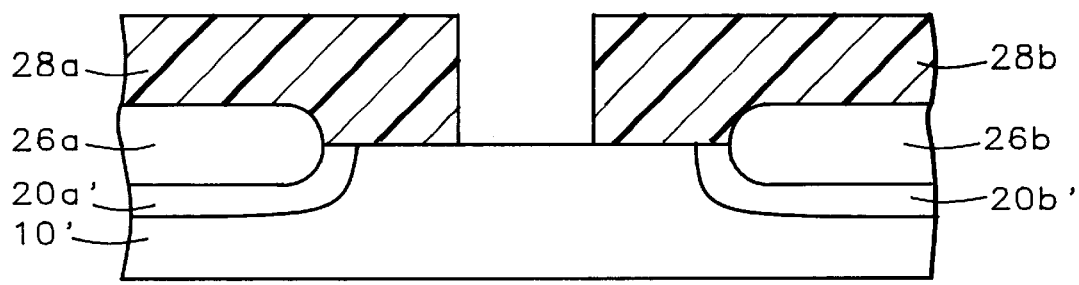

Referring now to FIG. 5, there is shown a schematic cross-sectional diagram illustrating the results of further processing of the integrated circuit microelectronics fabrication whose schematic cross-sectional diagram is illustrated in FIG. 4. Shown in FIG. 5 is a schematic cross-sectional diagram illustrating the integrated circuit microelectronics fabrication whose schematic cross-sectional diagram is illustrated in FIG. 4, but wherein: (1) the semiconductor substrate 10 is thermally oxidized to form the partially consumed semiconductor substrate 10' having formed therein and thereupon, (2) a pair of isolation regions 26a and 26b having formed therebelow; (3) a pair of diffused channel stop ion implant regions 20a' and 20b'. As is also illustrated within the integrated circuit microelectronics fabrication whose schematic cross-sectional diagram is illustrated in FIG. 5, the patterned silicon nitride layer 14a and the patterned pad oxide layer 12a are also stripped from the integrated circuit microelectronics fabrication. Finally there is also shown formed then upon the integrated circuit microelectronics fabrication whose schematic cross-sectional diagram is illustrated in FIG. 5 a pair of patterned second photoresist layers 28a and 28b.

The semiconductor substrate 10 as illustrated in FIG. 4 may be thermally oxidized to form the partially consumed semiconductor substrate 10' as illustrated in FIG. 5 having formed therein and thereupon the pair of isolation regions 26a and 26b having formed therebelow the pair of diffused channel stop ion implant regions 20a' and 20b' through thermal oxidation methods as are conventional in the art of integrated circuit microelectronics fabrication, which thermal oxidation methods typically employ a temperature of from about 950 to about 1000 degrees centigrade for a time period of from about 160 to about 200 minutes. Similarly, the patterned silicon nitride layer 14a and the patterned pad oxide layer 12a may be stripped from the partially consumed semiconductor substrate 10' whose schematic cross-sectional diagram is illustrated in FIG. 5 through methods as are conventional in the art of integrated circuit microelectronics fabrication, which methods will typically employ etchants such as but not limited to refluxing phosphoric acid for stripping silicon nitride layers and dilute aqueous hydrofluoric acid for stripping silicon oxide pad oxide layers. Finally, the patterned second photoresist layers 28a and 28b may be formed upon the integrated circuit microelectronics fabrication whose schematic cross-sectional diagram is illustrated in FIG. 5 through methods, materials and dimensions analogous or equivalent to the methods, materials and dimensions employed in forming the patterned first photoresist layer 16 upon the integrated circuit microelectronics fabrication whose schematic cross-sectional diagram is illustrated in FIG. 1.

Figure 6:
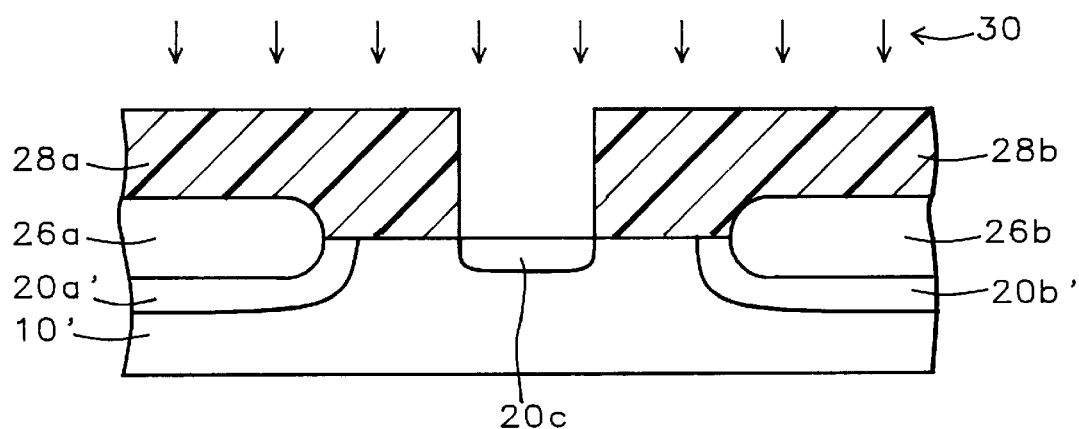

Referring now to FIG. 6, there is shown a schematic cross-sectional diagram illustrating the results of further processing of the integrated circuit microelectronics fabrication whose schematic cross-sectional diagram is illustrated in FIG. 5. Shown in FIG. 6 is a schematic cross-sectional diagram of an integrated circuit microelectronics fabrication otherwise equivalent to the integrated circuit microelectronics fabrication whose schematic cross-sectional diagram is illustrated in FIG. 5, but wherein there is formed within the partially consumed semiconductor substrate 10' a threshold adjusting ion implant region 20c at the location of the aperture defined by the patterned second photoresist layers 28a and 28b. The threshold adjusting ion implant region is formed through implanting into the partially consumed semiconductor substrate 10' a dose of threshold adjusting implanting ions 30, thus simultaneously forming from the pair of patterned second photoresist layers 28a and 28b a pair of ion implanted patterned second photoresist layers 28a' and 28b'. Typically and preferably, the dose of threshold adjusting implanting ions 30 is provided at an ion implantation dose of from about 3E12 to about 5E12 dopant ions per square centimeter and an ion implantation energy of from about 20 to about 30 keV. Within integrated circuit microelectronics fabrications, threshold adjusting implanting ions may generally be of either the same polarity or the opposite polarity to the polarity of a semiconductor substrate, and threshold adjusting implanting ions will typically and preferably employ dopant ions selected from the group of dopant ions including but not limited to arsenic containing dopant ions, boron containing dopant ions and phosphorus containing dopant ions.

Figure 7:
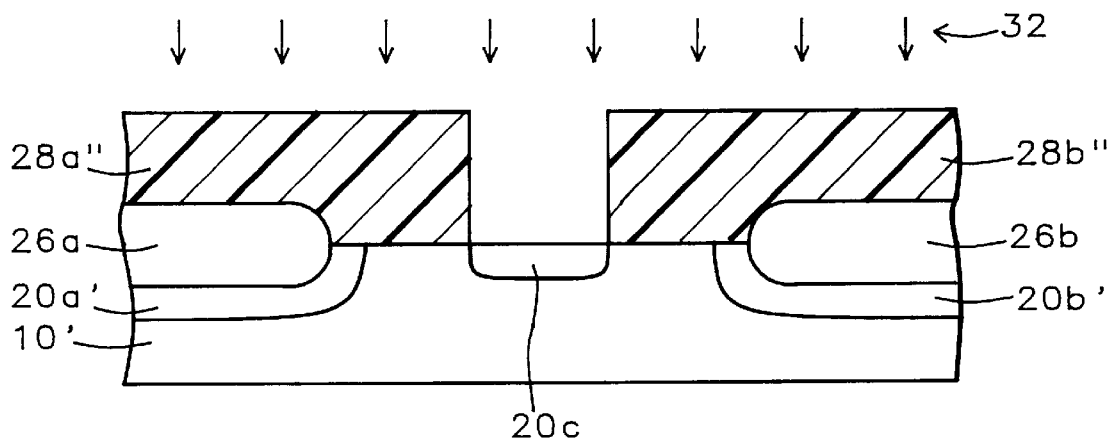

Referring now to FIG. 7, there is shown a schematic cross-sectional diagram illustrating the results of further processing of the integrated circuit microelectronics fabrication whose schematic cross-sectional diagram is illustrated in FIG. 6. Shown in FIG. 7 is a schematic cross-sectional diagram of an integrated circuit microelectronics fabrication otherwise equivalent to the integrated circuit microelectronics fabrication whose schematic cross-sectional diagram is illustrated in FIG. 6, but wherein the ion implanted patterned second photoresist layers 28a' and 28b' have been treated within a first plasma 32 to form a pair of fluorine containing plasma treated ion implanted patterned second photoresist layers 28a" and 28b". The first plasma 32 through which the fluorine containing plasma treated ion implanted patterned second photoresist layers 28a" and 28b" as illustrated in FIG. 7 are formed from the ion implanted patterned second photoresist layers 28a' and 28b' as illustrated in FIG. 6 is preferably formed through methods and materials analogous or equivalent to the methods and materials employed in forming the first plasma 22 through which the fluorine plasma treated ion implanted patterned first photoresist layer 16" as illustrated in FIG. 3 is formed from the ion implanted patterned first photoresist layer 16' as illustrated in FIG. 2.

Figure 8:
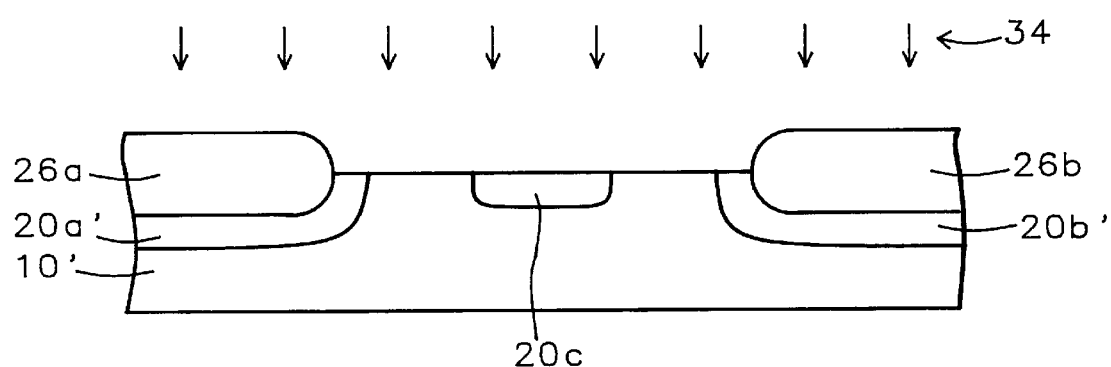

Referring now to FIG. 8, there is shown a schematic cross-sectional diagram illustrating the results of further processing of the integrated circuit microelectronics fabrication whose schematic cross-sectional diagram is illustrated in FIG. 7. Shown in FIG. 8 is an integrated circuit microelectronics fabrication otherwise equivalent to the integrated circuit microelectronics fabrication whose schematic cross-sectional diagram is illustrated in FIG. 7, but wherein the fluorine containing plasma treated ion implanted patterned second photoresist layers 28a" and 28b" are stripped from the integrated circuit microelectronics fabrication by means of a second plasma 34. The second plasma 34 through which the fluorine containing plasma treated ion implanted patterned second photoresist layers 28a" and 28b" are stripped from the integrated circuit microelectronics fabrication whose schematic cross-sectional diagam is illustrated in FIG. 7 to form the integrated circuit microelectronics fabrication whose schematic cross-sectional diagram is illustrated in FIG. 8 is preferably formed through methods and materials analogous or equivalent to the methods and materials employed in forming the second plasma 24 through which the fluorine containing plasma treated ion implanted patterned first photoresist layer 16" within the integrated circuit microelectronics fabrication whose schematic cross-sectional diagram is illustrated in FIG. 3 is stripped to form the integrated circuit microelectronics fabrication whose schematic cross-sectional diagram is illustrated in FIG. 4.

Figure 9:
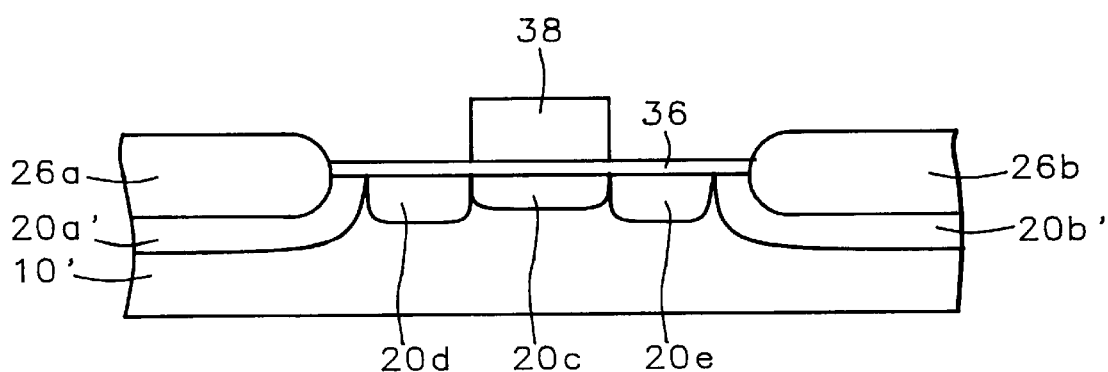

Referring now to FIG. 9, there is shown a schematic cross-sectional diagram illustrating the results of further processing of the integrated circuit microelectronics fabrication whose schematic cross-sectional diagram is illustrated in FIG. 8. Shown in FIG. 9 is: (1) a gate dielectric layer 36 formed upon the active region of the partially consumed semiconductor substrate 10'; (2) a gate electrode formed upon the gate dielectric layer, and (3) a pair of source/drain regions 20d and 20e formed into the active region of the partially consumed semiconductor substrate 10' at areas not covered by the gate electrode, thus forming a metal oxide semiconductor field effect tranistor (MOSFET) within and upon the active region of the partially consumed semiconductor substrate 10'. While each of the gate dielectric layer 36, the gate electrode 38 and the pair of source/drain regions 20d and 20e may be formed through methods and materials as are conventional in the art of forming metal oxide semiconductor field effect transistors (MOSFETs) within integrated circuit microelectronics fabrications, the gate dielectric layer 36, in particular, is preferably formed through a thermal oxidation method at a temperature of from about 750 to about 850 degrees centigrade for a time period of from about 100 to about 120 minutes to form the gate dielectric layer 36 of silicon oxide of thickness about 65 to about 85 angstroms. Similarly, the gate electrode 38 is preferably formed to a thickness of from about 2000 to about 2800 angstroms upon the gate dielectric layer 36, typically and preferably from a polysilicon or polycide gate electrode material. Finally, each of the source/drain regions 20d or 20e within the pair of source/drain regions 20d and 20e is formed through ion implanting a dose of source/drain implanting ions into the active region of the partially consumed semiconductor substrate 10' at an ion implantation dose of from about 2E15 to about 5E15 ions per square centimeter and an ion implantation energy of from about 30 to about 50 keV.

Notable within the metal oxide semiconductor field effect transistor (MOSFET) formed within the integrated circuit microelectronics fabrication whose schematic cross-sectional diagram is illustrated in FIG. 9 is that the gate dielectric layer 36 formed of silicon oxide through the thermal oxidation method is formed with more uniform dielectric properties when the ion implanted patterned second photoresist layers 28a' and 28b' are stripped from the integrated circuit microelectronics fabrication whose schematic cross-sectional diagram is illustrated in FIG. 6 to form the integrated circuit microelectronics fabrication whose schematic cross-sectional diagram is illustrated in FIG. 8 through the sequential two step plasma stripping method of the present invention, since through the method of the present invention the partially consumed semiconductor substrate 10' sustains less plasma induced damage when there is removed therefrom the ion implanted patterned photoresist second layers 28a' and 28b' through the sequential two step plasma stripping method of the present invention.

EXAMPLES

Upon the surfaces of each of two doped silicon semiconductor substrates was formed a blanket photoresist layer from a positive photoresist material. The blanket photoresist layer upon each of the two semiconductor substrates was then ion implanted with a dose of boron containing implanting ions at an ion implantation dose of about 9E12 ions per square centimeter and an ion implantation energy of about 120 keV.

The ion implanted blanket photoresist layer upon one of the two semiconductor substrates was then stripped from the semiconductor substrate in accord with the preferred embodiment of the method of the present invention. The ion implanted blanket photoresist layer was first treated with a first plasma employing a first etchant gas composition consisting of hexafluoroethane and oxygen to form a fluorine containing plasma treated ion implanted blanket photoresist layer. The first plasma also employed: (1) a reactor chamber pressure of about 10 torr; (2) a radio frequency power of about 600 watts at a radio frequency of 13.56 MHZ; (3) a semiconductor substrate temperature of about 250 degrees centigrade; (4) a hexafluoroethane flow rate of about 40 standard cubic centimeters per minute (sccm); (5) an oxygen flow rate of about 8000 standard cubic centimeters per minute; and (6) an exposure time of about 30 seconds.

The fluorine containing plasma treated ion implanted blanket photoresist layer upon the first semiconductor substrate was then stripped from the first semiconductor substrate through a second plasma employing an etchant gas composition consisting of oxygen. The second plasma also employed: (1) a reactor chamber pressure of about 10 torr;

(2) a radio frequency power of about 600 watts at a radio frequency of 13.56 MHZ; (3) a semiconductor substrate temperature of about 250 degrees centigrade; (4) an oxygen flow rate of about 8000 standard cubic centimeters per minute (sccm); and (5) an exposure time of about 100 seconds.

The ion implanted blanket photoresist layer upon the second of the two semiconductor substrates was stripped from the second semiconductor substrate through a method within which the ordering of the first plasma and the second plasma were reversed, but wherein the first plasma and the second plasma were otherwise equivalent to the first plasma and the second plasma employed in stripping the ion implanted blanket photoresist layer from the first of the two semiconductor substrates.

The two semiconductor substrates were then reunited and they were simultaneously thermally oxidized at a temperature of about 800 degrees centigrade for a time period of about 110 minutes to form upon each of the two semiconductor substrates a thermal silicon oxide layer of thickness about 70 angstroms. The uniformity and integrity of the two thermal silicon oxide layers were then measured by forming a series of capacitors upon each of the two semiconductor substrates while employing separate portions of each of the two thermal silicon oxide layer as the capacitor dielectric layers. The mean values of the capacitances of the two series of capacitors formed upon the two semiconductor substrates were then determined through electrical test methods as are conventional in the art of integrated circuit microelectronics fabrication. The mean values so determined are reported in Table I, along with the corresponding calculated standard deviations.

TABLE 1

| Example | P/R Strip Process | Data Points | Mean Capacitance | Std. Deviation |
|---|---|---|---|---|
| 1 | C2F6/O2-->O2 | 160 | 11.35 pf | +/-0.22 pf |
| 2 | O2-->C2F6/O2 | 240 | 11.16 | +/-1.08 |

From review of the data in Table I, it is seen that the two step sequential ion implanted photoresist stripping method as employed within the context of the preferred embodiment of the present invention provides an ion implanted photoresist stripping method which provides a semiconductor substrate from which there may be formed through a thermal oxidation method a silicon oxide dielectric layer with slightly higher dielectric capacity and substantially greater uniformity in comparison with an otherwise equivalent two step photoresist stripping method where the sequence of the plasma steps within the two step sequential ion implanted photoresist stripping method is reversed. The enhanced properties of the thermal silicon oxide dielectric layers formed subsequent to the two step ion implanted photoresist layer stripping method of the present invention are presumably due to less plasma induced damage sustained by a silicon semiconductor substrate from which is stripped an ion implanted photoresist layer through the method of the present invention.

As is understood by a person skilled in the art, the preferred embodiment and examples of the present invention are illustrative of the present invention rather than limiting of the present invention. Revisions and modifications may be made to methods, materials, structures and dimensions through which is provided the preferred embodiment and examples of the present invention while still providing embodiments and examples which are within the spirit and scope of the present invention, as defined by the accompanying claims.

What is claimed is:

1. A method for stripping an ion implanted photoresist layer from a substrate comprising:

providing a substrate employed within a microelectronics fabrication;

forming over the substrate an ion implanted photoresist layer;

treating the ion implanted photoresist layer with a first plasma employing a first etchant gas composition comprising an oxygen containing species and a fluorine containing species to form a fluorine plasma treated ion implanted photoresist layer; and stripping from the substrate the fluorine plasma treated ion implanted photoresist layer with a second plasma employing a second etchant gas composition comprising the oxygen containing species without the fluorine containing species.

2. The method of claim 1 wherein the ion implanted photoresist layer is stripped from the substrate while avoiding plasma induced damage to the substrate.

3. The method of claim 1 wherein the microelectronics fabrication is selected from the group of microelectronics fabrications consisting of integrated circuit microelectronics fabrications, solar cell microelectronics fabrications, ceramic packaging microelectronics fabrications and flat panel display microelectronics fabrications.

4. The method of claim 1 wherein the ion implanted photoresist layer is implanted with ions selected from the group of ions consisting of arsenic containing ions, boron containing ions and phosphorus containing ions.

5. The method of claim 1 wherein:

the fluorine containing species is chosen from the group of fluorine containing species consisting of fluorine, fluorobons and perfluorocarbons; and the oxygen containing species is chosen from the group of oxygen containing species consisting of oxygen and ozone.

6. The method of claim 1 wherein the first etchant gas composition comprises:

hexafluoroethane at a flow rate of from about 20 to about 60 standard cubic centimeters per minute (sccm); and oxygen at a flow rate of from about 6000 to about 10000 standard cubic centimeters per minute (sccm).

7. The method of claim 6 wherein the first plasma employs:

a reactor chamber pressure of from about 5 to about 15 torr; and a radio frequency power of from about 500 to about 700 watts at a radio frequency of 13.56 MHZ.

8. The method of claim 7 wherein the second plasma employs:

oxygen gas at a flow rate of from about 6000 to about 10000 standard cubic centimeters per minute (sccm);

a reactor chamber pressure of from about 5 to about 15 torr, and a radio frequency power of from about 500 to about 700 watts at a radio frequency of 13.56 MHZ.

9. A thermal oxidation method for forming a thermal silicon oxide layer upon a silicon semiconductor substrate comprising:

providing a silicon semiconductor substrate;

forming upon the silicon semiconductor substrate an ion implanted photoresist layer;

treating the ion implanted photoresist layer with a first plasma employing a first etchant gas composition comprising an oxygen containing species and a fluorine containing species to form a fluorine plasma treated ion implanted photoresist layer;

stripping from the silicon semiconductor substrate the fluorine plasma treated ion implanted photoresist layer with a second plasma employing a second etchant gas composition comprising the oxygen containing species without the fluorine containing species; and thermally oxidizing the silicon semiconductor substrate to form a thermal silicon oxide layer upon the silicon semiconductor substrate.

10. The method of claim 9 wherein the thermal silicon oxide layer is formed with more uniform dielectric characteristics than an otherwise equivalent thermal silicon oxide layer formed upon an otherwise equivalent silicon semiconductor substrate from which has been stripped an otherwise equivalent ion implanted photoresist layer employing the second plasma followed by the first plasma.

11. The method of claim 9 wherein the ion implanted photoresist layer is implanted with ions selected from the group of ions consisting of arsenic containing ions, boron containing ions and phosphorus containing ions.

12. The method of claim 9 wherein the ion implanted photoresist layer is an ion implanted patterned photoresist layer employed as an ion implantation mask when forming an ion implant region within the silicon semiconductor substrate.

13. The method of claim 9 wherein:

the fluorine containing species is chosen from the group of fluorine containing species consisting of fluorine, fluorocarbons and perfluorocarbons; and the oxygen containing species is chosen from the group of oxygen containing species consisting of oxygen and ozone.

14. The method of claim 9 wherein the first etchant gas composition comprises:

hexafluoroethane at a flow rate of from about 20 to about 60 standard cubic centimeters per minute (sccm); and oxygen at a flow rate of from about 6000 to about 10000 standard cubic centimeters per minute (sccm).

15. The method of claim 14 wherein the first plasma employs:

a reactor chamber pressure of from about 5 to about 15 torr; and a radio frequency power of from about 500 to about 700 watts at a radio frequency of 13.56 MHZ.

16. The method of claim 15 wherein the second plasma employs:

oxygen at a flow rate of from about 6000 to about 8000 standard cubic centimeters per minute (sccm);

a reactor chamber pressure of from about 5 to about 15 torr; and a radio frequency power of from about 500 to about 700 watts at a radio frequency of 13.56 MHZ.

* * * * *